(12) United States Patent
Okayama

(10) Patent No.: US 9,325,257 B2
(45) Date of Patent: Apr. 26, 2016

(54) POWER SEMICONDUCTOR DEVICE TO REDUCE VOLTAGE VARIATION BETWEEN TERMINALS

(71) Applicant: Panasonic Intellectual Property Management Co., Ltd., Osaka (JP)

(72) Inventor: Yoshio Okayama, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 13 days.

(21) Appl. No.: 14/402,492

(22) PCT Filed: Apr. 9, 2013

(86) PCT No.: PCT/JP2013/002411
§ 371 (c)(1),
(2) Date: Nov. 20, 2014

(87) PCT Pub. No.: WO2013/179547
PCT Pub. Date: Dec. 5, 2013

(65) Prior Publication Data
US 2015/0155797 A1    Jun. 4, 2015

(30) Foreign Application Priority Data

Jun. 1, 2012  (JP) .................................. 2012-125833

(51) Int. Cl.
*H02M 7/537*   (2006.01)
*H01L 25/07*   (2006.01)
(Continued)

(52) U.S. Cl.
CPC ............... *H02M 7/537* (2013.01); *H01L 23/48* (2013.01); *H01L 23/49541* (2013.01);
(Continued)

(58) Field of Classification Search
CPC ............................... H02M 7/537; H01L 25/07
See application file for complete search history.

(56) References Cited

U.S. PATENT DOCUMENTS

| 7,045,903 B2 * | 5/2006 | Efland ................. H01L 23/4952 257/784 |
| 2013/0286617 A1 * | 10/2013 | Shibasaki ............ H01L 23/049 361/772 |

FOREIGN PATENT DOCUMENTS

| JP | 2004022960 | 1/2004 |
| JP | 2004-134460 A | 4/2004 |

(Continued)

OTHER PUBLICATIONS

Supplementary European Search Report for EP 13797797.1, Jun. 26, 2015.

(Continued)

*Primary Examiner* — Emily P Pham
(74) *Attorney, Agent, or Firm* — RatnerPrestia

(57) ABSTRACT

The purpose of the present invention is to reduce variance of a voltage to be applied between the terminals of each of the power semiconductor elements, and to improve lifetime of the power semiconductor elements and reliability of the power semiconductor device. In order to achieve the purpose, in this power semiconductor device, which is provided with three or more power semiconductor elements that are aligned and mounted on a metal wire, and another metal wire different from the metal wire, one terminal of each of the power semiconductor elements being connected to the wire and another one terminal thereof being connected to the other wire, the resistance value of the metal wire in a region where the power semiconductor elements are mounted is higher in the downstream side than that in the upstream side in the electric current flowing direction.

10 Claims, 5 Drawing Sheets

(51) Int. Cl.
*H02M 7/00* (2006.01)
*H01L 23/495* (2006.01)
*H01L 23/48* (2006.01)
*H01L 23/498* (2006.01)
*H01L 23/50* (2006.01)
*H01L 25/18* (2006.01)
*H01L 23/31* (2006.01)
*H01L 23/00* (2006.01)
*H02M 1/088* (2006.01)

(52) U.S. Cl.
CPC ... *H01L 23/49562* (2013.01); *H01L 23/49575* (2013.01); *H01L 23/49844* (2013.01); *H01L 23/50* (2013.01); *H01L 24/49* (2013.01); *H01L 25/07* (2013.01); *H01L 25/072* (2013.01); *H02M 7/003* (2013.01); *H01L 23/3107* (2013.01); *H01L 24/06* (2013.01); *H01L 24/32* (2013.01); *H01L 24/45* (2013.01); *H01L 24/48* (2013.01); *H01L 24/73* (2013.01); *H01L 25/18* (2013.01); *H01L 2224/04042* (2013.01); *H01L 2224/0603* (2013.01); *H01L 2224/06181* (2013.01); *H01L 2224/32225* (2013.01); *H01L 2224/32245* (2013.01); *H01L 2224/45014* (2013.01); *H01L 2224/45124* (2013.01); *H01L 2224/45144* (2013.01); *H01L 2224/45147* (2013.01); *H01L 2224/48227* (2013.01); *H01L 2224/48247* (2013.01); *H01L 2224/4903* (2013.01); *H01L 2224/49175* (2013.01); *H01L 2224/73265* (2013.01); *H01L 2924/1203* (2013.01); *H01L 2924/1305* (2013.01); *H01L 2924/1306* (2013.01); *H01L 2924/13055* (2013.01); *H01L 2924/13091* (2013.01); *H01L 2924/15787* (2013.01); *H01L 2924/181* (2013.01); *H01L 2924/30101* (2013.01); *H01L 2924/30107* (2013.01); *H02M 1/088* (2013.01)

(56) References Cited

FOREIGN PATENT DOCUMENTS

| | | |
|---|---|---|
| JP | 2004134460 | 4/2004 |
| JP | 2004273749 | 9/2004 |
| JP | 2010034347 | 2/2010 |

OTHER PUBLICATIONS

Didier Cottet et al., Numerical Comparison of Packaging Technologies for Power Electronics Modules, Power Electronics Specialists Conference 2005, IEEE 36th, pp. 2187-2193, Jan. 1, 2005, Piscataway, NJ, USA.

International Search Report for International Application No. PCT/JP2013/002411 mailed Jul. 9, 2013.

* cited by examiner

POWER SEMICONDUCTOR DEVICE TO REDUCE VOLTAGE VARIATION BETWEEN TERMINALS

CROSS-REFERENCE TO RELATED APPLICATIONS

This application is a U.S. national phase application of PCT International Patent Application No. PCT/JP2013/002411 filed Apr. 9, 2013, claiming the benefit of priority of Japanese Patent Application No. 2012-125833 filed Jun. 1, 2012, all of which are incorporated by reference herein in their entirety.

TECHNICAL FIELD

The present invention relates to a power semiconductor device which treats the large electric current of a power converter and the like.

BACKGROUND ART

The power semiconductor device is used for various uses including a power converter (inverter) used for a power conditioner of a solar cell, a motor drive control, a compressor control of an air-conditioner and the like. The further energy saving of home electric appliances and the like, and the spread of natural power sources, such as solar power generation, are progressing especially in recent years for realization of a countermeasure of the global warming and a sustainable society. Therefore, the need for the power semiconductor device also increases, and the technology development for correspondence to the large electric power and large electric current and the high efficiency thereof is performed.

Japanese Patent Application Publication No. 2004-22960 relates to the power semiconductor device (inverter module), especially the reduction and equalization of parasitic inductance and the routing of the gate wire in parallelization of the power semiconductor elements, such as MOSFET (Metal Oxide Semiconductor Field Effect Transistor) or IGBT (Insulated Gate Bipolar Transistor) corresponding to improvement in speedup of the switching speed and enlargement of the electric current, are described.

FIG. 7 is a schematic plan view which shows the internal configuration of the conventional power semiconductor device which is disclosed by, for example, Japanese Patent Application Publication No. 2004-22960.

The conventional power semiconductor device, which is shown in FIG. 7, is a power module of so-called 2in1 where four MOSFETs 107 as power semiconductor elements that perform switching on the high-voltage side and four MOSFETs 108 as elements that perform switching on the low-voltage side are mounted on the lead frame in parallel at each side. This module functions as a single-phase inverter circuit in a case of two pieces and as a three-phase inverter circuit in a case of three pieces.

The portions denoted by reference numerals 101, 102 and 103 as shown in FIG. 7, which are exposed from mold resin 115 toward the exterior, are external connection terminals of the power circuit respectively. For example, the high-voltage side of the direct-current power is applied to the external connection terminal 101 and the low-voltage side of the direct-current power is applied to the external connection terminal 103 to input the direct-current power, and alternating-current power is output to the external wire which is connected to the external connection terminal 102.

A surface of each element of the MOSFETs 107 and 108 shown in FIG. 7 is provided with a gate electrode 111, a region of the surface other than the gate electrode 111 is provided with a source electrode 121$s$, and a back surface of each element is provided with a drain electrode.

The source electrodes 121$s$ of MOSFETs 107 are connected to a metal wire 105 that leads to the output terminal (external connection terminal 102), by wires (or ribbons) 109 which are made from aluminum or copper, the source electrodes 121$s$ of MOSFETs 108 are connected to a metal wire 106 that leads to the low-voltage side terminal of input (external connection terminal 103), by wires (or ribbons) 110 which are made from aluminum or copper, and then the power circuit is formed.

The gate electrode 111 and source electrode 121$s$ of each element are connected to a gate electrode terminal 113 and a source electrode terminal 114 by a bonding wire 112 which is made from aluminum or gold respectively, they are connected to a control circuit (not shown) which is disposed outside the module, and then control required for inverter operation is performed.

Meanwhile, in FIG. 7, the wires 109, 110 and 112, which are connected to each MOSFET, are formed in equal length and the same form so that the parasitic inductance may become equal. Furthermore, the arrangement of the metal wires 104, 105 and 106, the gate electrode terminal 113, and the source electrode terminal 114 is designed so that the routing of the wires 109, 110 and 112 may become short.

SUMMARY OF THE INVENTION

Problems to be Solved by the Invention

However, as for the conventional example shown in FIG. 7, in the case where equal electric current flows into four MOSFETs 107, which perform the switching operation of the high-voltage side, or in the case where equal electric current flows into four MOSFETs 108, which perform the switching operation of the low-voltage side, when this inventor calculated the voltage drop resulting from wiring resistances of the metal wires 104, 105 and 106, the inventor found out that the voltage applied between the source and drain of each MOSFET was uneven. Regarding this point, descriptions are given referring to an electric circuit diagram shown in FIG. 8.

FIG. 8 is an equivalent circuit of the conventional power semiconductor device which is shown in FIG. 7.

As shown in FIG. 8, the wiring resistances of the metal wire 104 (see FIG. 7) are denoted by Ra1 to Ra4, the wiring resistances of the region of the metal wire 105 (see FIG. 7), to which wires 109 are connected, are denoted by Rb1 to Rb4, the wiring resistances of the region of the metal wire 105 (see FIG. 7), on which MOSFETs 108 are mounted, are denoted by Rc1 to Rc4, the wiring resistances of the metal wire 106 (see FIG. 7) are denoted by Rd1 to Rd4, and the wiring resistance of the wire 109 (see FIG. 7) and the wire 110 (see FIG. 7) is denoted by Rw.

ON states of the MOSFETs 107 (see FIG. 7 and FIG. 8) and OFF states of the MOSFETs 108 (see FIG. 7 and FIG. 8) are assumed, and then the voltage of the external connection terminal 101 (see FIG. 7 and FIG. 8) is set to 1 V, the voltage of the external connection terminal 102 (see FIG. 7 and FIG. 8) is set to 0 V, the electric current which flows through each one of four MOSFETs 107 (see FIG. 7 and FIG. 8) is set to 50 A. As for the wiring resistances of the metal wires, since the widths of the wires are constant, Ra2=Ra3=Ra4 and Rb1=Rb2=Rb3, the wiring resistance is allowed to be 0.1 mΩ in this calculation. As for Ra1 and Rb4, since the length of the wire is long, the wiring resistance is allowed to be 0.2 mΩ. Additionally, the wiring resistance Rw of the wire is allowed to be 0.3 mΩ.

When the potential of each electrode was calculated using the above values, each voltage, which is applied between the source electrodes 121s and the drain electrodes 121d of four MOSFETs 107 (see FIG. 7 and FIG. 8) respectively, was 0.875V, 0.865V, 0.865V, and 0.875V in an order from the top of FIG. 7. That is, the different voltage is applied to four MOSFETs which are arranged in parallel, and as a result, in the configuration of the conventional power semiconductor device in which the variance of each voltage applied between the source electrodes 121s and the drain electrodes 121d has not been taken into consideration, there is a problem that anxiety about the unbalance of the electric current and the bad influence to the reliability of each MOSFET arises.

An aspect of the present invention, in consideration of the above-stated conventional problems, furnishes a power semiconductor device which is able to suppress the ununiformity of the voltages that are applied to the power semiconductor elements.

Means for Solving the Problem

The $1^{st}$ aspect of the present invention is a power semiconductor device comprising:

a first metal wire which is connected to a first external connection terminal;

a second metal wire which is connected to a second external connection terminal;

a third metal wire which is connected to a third external connection terminal;

a first power semiconductor element group which includes three or more first power semiconductor elements that are mounted on the first metal wire; and a second power semiconductor element group which includes second power semiconductor elements of the same number as the first power semiconductor elements, the second power semiconductor elements being mounted on the second metal wire, wherein an electrode which the first power semiconductor element is provided with is connected to the second metal wire by a first conductive member, and an electrode which the second power semiconductor element is provided with is connected to the third metal wire by a second conductive member, and with respect to a resistance value of a region on which the first power semiconductor element group or the second power semiconductor element group is mounted, the resistance value of a downstream side is larger than that of an upstream side in an electric current flowing direction, the region being included in the first metal wire or the second metal wire, or with respect to a resistance value of a region to which the first conductive member or the second conductive member is connected, the resistance value of a downstream side is smaller than that of an upstream side in the electric current flowing direction, the region being included in the second metal wire or the third metal wire.

According to the above-stated configuration, it is possible to suppress the ununiformity of the voltage which is applied to each power semiconductor element, the ununiformity being caused by a voltage drop of the metal wire.

Moreover, the $2^{nd}$ aspect of the present invention is the power semiconductor device according to the $1^{st}$ aspect of the present invention, wherein regarding the first metal wire, the second metal wire and the third metal wire, regions on which the first power semiconductor element group and the second power semiconductor element group are mounted and regions to which the first conductive member and the second conductive member are connected are of straight line-like shape substantially, and the regions with the straight line-like shape of the first metal wire, the second metal wire and the third metal wire are disposed in parallel to each other substantially.

Moreover, the $3^{rd}$ aspect of the present invention is the power semiconductor device according to the $1^{st}$ or $2^{nd}$ aspect of the present invention, wherein a width of the region with the straight line-like shape, on which the first power semiconductor element group or the second power semiconductor element group is mounted, becomes narrow gradually toward the electric current flowing direction, or a width of the region with the straight line-like shape, to which the first conductive member or the second conductive member is connected, becomes wide gradually toward the electric current flowing direction.

Moreover, the $4^{th}$ aspect of the present invention is the power semiconductor device according to the $1^{st}$ or $2^{nd}$ aspect of the present invention, wherein a slit or a notch is located on the region with the straight line-like shape, on which the first power semiconductor element group or the second power semiconductor element group is mounted, and then the resistance value of the region is set so as to become large gradually toward the electric current flowing direction, or a slit or a notch is located on the region with the straight line-like shape, to which the first conductive member or the second conductive member is connected, and then the resistance value of the region is set so as to become small gradually toward the electric current flowing direction.

Moreover, the $5^{th}$ aspect of the present invention is the power semiconductor device according to the $1^{st}$ or $2^{nd}$ aspect of the present invention, wherein regarding the regions with the straight line-like shape of the first metal wire, the second metal wire and the third metal wire, (1) the resistance values of the regions, to which the first conductive member and the second conductive member are connected, become small gradually toward the electric current flowing direction, and (2) the resistance values of the regions, on which the first power semiconductor element group and the second power semiconductor element group are mounted, become large gradually toward the electric current flowing direction.

According to the above-stated configuration, it is possible to more effectively suppress the ununiformity of the voltage which is applied to each power semiconductor element.

Moreover, the $6^{th}$ aspect of the present invention is the power semiconductor device according to any one of the $1^{st}$ to $5^{th}$ aspects of the present invention, wherein the first external connection terminal and the third external connection terminal are connected to one side end portion of the first metal wire and one side end portion of the third metal wire, the first metal wire and the third metal wire being parallel to each other substantially and being of the straight line-like shape, and the second external connection terminal is connected to the other side end portion of the second metal wire at an opposite side of the one side end portion.

Moreover, the $7^{th}$ aspect of the present invention is the power semiconductor device according to any one of the $1^{st}$ to $6^{th}$ aspects of the present invention, wherein the power semiconductor device is a part which constitutes a power conversion equipment or a power conversion circuit that converts direct-current power into alternating-current power.

Moreover, the $8^{th}$ aspect of the present invention is the power semiconductor device according to the $7^{th}$ aspect of the present invention, wherein a direct-current voltage is applied to the first external connection terminal and the third external connection terminal and an alternating-current voltage is output from the second external connection terminal.

Moreover, the $9^{th}$ aspect of the present invention is the power semiconductor device according to any one of the $1^{st}$ to $8^{th}$ aspects of the present invention, wherein the first power semiconductor element or the second power semiconductor element is a MOSFET which is provided with a source electrode, a drain electrode and a gate electrode, and a parasitic diode is formed between the source electrode and the drain electrode.

Moreover, the $9^{th}$ aspect of the present invention is the power semiconductor device according to any one of the $1^{st}$ to $8^{th}$ aspects of the present invention, wherein the first power semiconductor element group or the second power semiconductor element group includes three or more power semiconductor elements as switching elements and one or more rectifying device.

Effects of the Invention

According to the present invention, an effect that the ununiformity of the voltage, which is applied the respective power semiconductor elements, is able to be suppressed occurs.

MODES FOR IMPLEMENTING THE INVENTION

Figure 1:
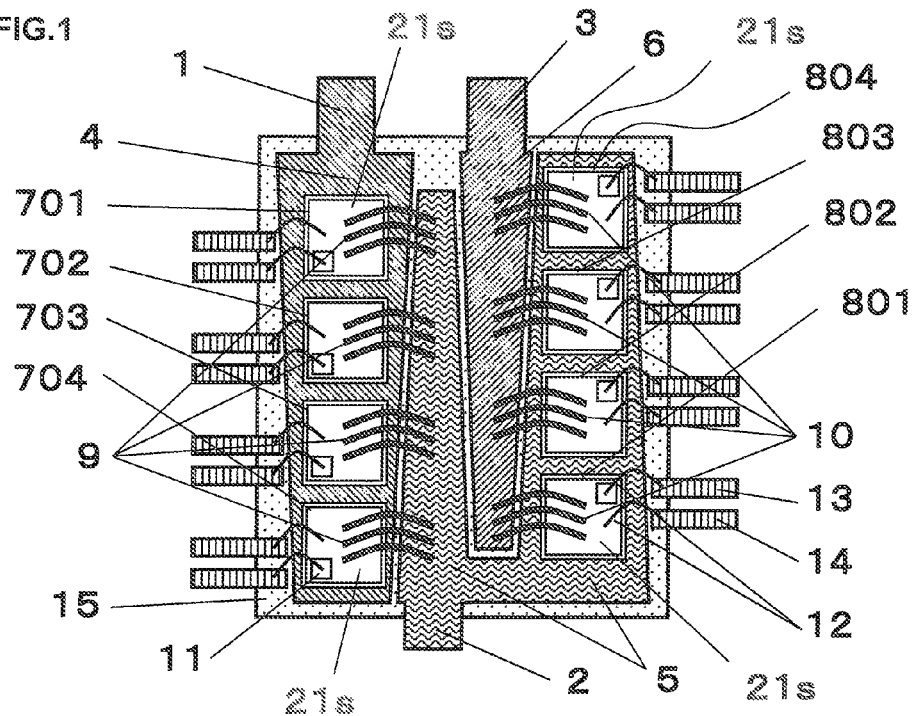
FIG. 1 is a schematic plan view which shows an internal configuration of a power semiconductor device according to one embodiment of the present invention.

In the following, regarding embodiments of the present invention, descriptions are given referring to the drawings.

Embodiment 1

FIG. 1 is a schematic plan view which shows the internal configuration of the power semiconductor device according to one embodiment of the present invention.

The power semiconductor device of the present embodiment, which is shown in FIG. 1, is a power module of so-called 2in1 where four MOSFETs 7 (701-704) as power semiconductor elements that perform switching on the high-voltage side and four MOSFETs 8 (801-804) as power semiconductor elements that perform switching on the low-voltage side are mounted on the lead frame in parallel at each side.

The portions denoted by reference numerals 1, 2 and 3 as shown in FIG. 1, which are exposed from mold resin 15 toward the exterior, are external connection terminals of the power circuit respectively. For example, the high-voltage side of the direct-current power is applied to the external connection terminal 1 and the low-voltage side of the direct-current power is applied to the external connection terminal 3 to input the direct-current power, and alternating-current power is output to the external wire which is connected to the external connection terminal 2.

Figure 2:
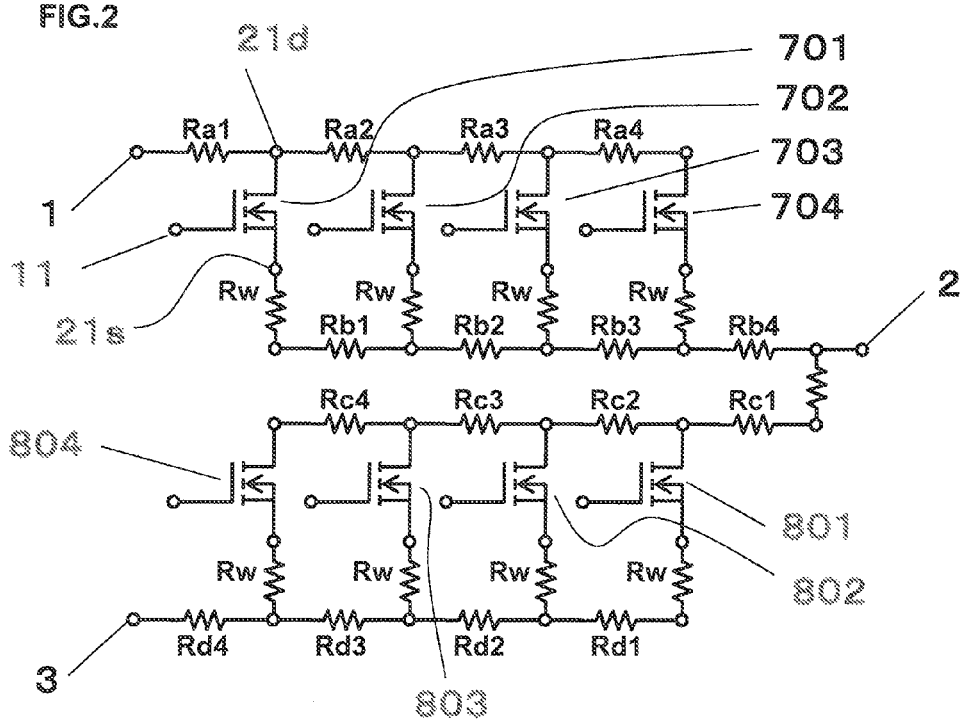
FIG. 2 is an electrical circuit diagram which shows the power semiconductor device according to the present invention.

A surface of each element of the MOSFETs 701-704 and the MOSFETs 801-804 shown in FIG. 1 is provided with a gate electrode 11, a region of the surface other than the gate electrode 11 is provided with a source electrode 21s, and a back surface of each element is provided with a drain electrode 21d (see FIG. 2).

The source electrodes 21s of MOSFETs 701-704, which are mounted on a metal wire 4 that leads to the external connection terminal 1 as the high-voltage side terminal of input, are connected to a metal wire 5 that leads to the external connection terminal 2 as the output terminal, by wires (or ribbons) 9 which are made from aluminum or copper, the source electrodes 21s of MOSFETs 801-804, which are mounted on a metal wire 5, are connected to a metal wire 6 that leads to the external connection terminal 3 as the low-voltage side terminal of input, by wires 10 (or ribbons) which are made from aluminum or copper, and then the power circuit is formed.

The gate electrode 11 and source electrode 21s of each element are connected to a gate electrode terminal 13 and a source electrode terminal 14 by a bonding wire 12 which is made from aluminum or gold respectively, they are connected to a control circuit (not shown) which is disposed outside the module, and then control required for inverter operation is performed.

By the way, the metal wire 4 of the present embodiment is one example of a first metal wire of the present invention, the metal wire 5 of the present embodiment is one example of a second metal wire of the present invention, and the metal wire 6 of the present embodiment is one example of a third metal wire of the present invention. Moreover, the external connection terminals 1, 2 and 3 of the present embodiment is one example of a first external connection terminal, a second external connection terminal, and a third external connection terminal of the present invention, respectively. Moreover, the wire (or ribbon) 9 of the present embodiment is one example of a first conductive member of the present invention, and the wire (or ribbon) 10 of the present embodiment is one example of a second conductive member of the present invention. Moreover, each of the MOSFETs 701-704 is one example of a first power semiconductor element of the present invention, and each of the MOSFETs 801-804 is one example of a second power semiconductor element of the present invention. Moreover, the configuration which includes four MOSFETs 701-704 is one example of a first power semiconductor element group of the present invention, and the configuration which includes four MOSFETs 801-804 is one example of a second power semiconductor element group of the present invention.

As shown in FIG. 1, regarding the metal wires 4, 5 and 6, the regions on which the power semiconductor elements (MOSFETs 701-704 and MOSFETs 801-804) are mounted and the regions to which the wires are connected have constant thickness of the wire, but they are formed so that each width of the wire gradually changes corresponding to the electric current flowing direction.

When the MOSFETs 701-704 on the high-voltage side are ON and the MOSFETs 801-804 on the low-voltage side are OFF, an electric current flows from the external connection terminal 1 to the metal wire 5 and the external connection terminal 2 via the metal wire 4, MOSFETs 701-704 and wires 9.

The region of the metal wire 4, on which MOSFETs 701-704 are mounted, is formed so that the width of the wire becomes narrow toward the electric current flowing direction, that is to say, the resistance of the wire becomes large toward the electric current flowing direction, and the region of the metal wire 5, to which the wires 9 are connected, is formed so that it becomes wide toward the electric current flowing direction, that is to say, the resistance of the wire becomes small toward the electric current flowing direction.

On the other hand, when the MOSFETs 701-704 on the high-voltage side are OFF and the MOSFETs 801-804 on the low-voltage side are ON, an electric current flows from the external connection terminal 2 to the metal wire 6 and the external connection terminal 3 via the metal wire 5, MOSFETs 801-804 and wires 10.

The region of the metal wire 5, on which MOSFETs 801-804 are mounted, is formed so that the width of the wire becomes narrow toward the electric current flowing direction, that is to say, the resistance of the wire becomes large toward the electric current flowing direction, and the region of the metal wire 6, to which the wires 10 are connected, is formed so that it becomes wide toward the electric current flowing direction, that is to say, the resistance of the wire becomes small toward the electric current flowing direction.

FIG. 2 is an electrical circuit diagram which shows the power semiconductor device according to the present invention. The wiring resistances of the metal wire 4 (FIG. 1) are denoted by Ra1 to Ra4 ($\Omega$), the wiring resistances of the region of the metal wire 5 (FIG. 1), to which wires 9 are connected, are denoted by Rb1 to Rb4 ($\Omega$), the wiring resistances of the region of the metal wire 5 (FIG. 1), on which MOSFETs 801-804 are mounted, are denoted by Rc1 to Rc4 ($\Omega$), the wiring resistances of the metal wire 6 (FIG. 1) are denoted by Rd1 to Rd4 ($\Omega$), and the wiring resistance of the wire 9 (FIG. 1) and the wire 10 (FIG. 1) is denoted by Rw ($\Omega$).

Here, ON states of the MOSFETs 701-704 and OFF states of the MOSFETs 801-804 are assumed, and then the voltage of the external connection terminal 1 is allowed to be denoted by Vdd (V), the voltage of the external connection terminal 2 is allowed to be denoted by Vss (V), electric currents which flow through the MOSFETs 701, 702, 703 and 704 are allowed to be denoted by I1, I2, I3, and I4 (A), respectively, and the electric current which flows through the external connection terminal 1 and the external connection terminal 2 is allowed to be denoted by I (A) (=I1+I2+I3+I4).

Under the above conditions, drain voltages Vd1 to Vd4 and source voltages Vs1 to Vs4 of MOSFETs 701-704 can be denoted by the following formulas (1)-(4) and the following formulas (5)-(8), respectively.

[Formula 1]

$$Vd1 = Vdd - (I1+I2+I3+I4)Ra1 \quad (1)$$

$$Vd2 = Vdd - (I1+I2+I3+I4)Ra1 - (I2+I3+I4)Ra2 \quad (2)$$

$$Vd3 = Vdd - (I1+I2+I3+I4)Ra1 - (I2+I3+I4)Ra2 - (I3+I4)Ra3 \quad (3)$$

$$Vd4 = Vdd - (I1+I2+I3+I4)Ra1 - (I2+I3+I4)Ra2 - (I3+I4)Ra3 - I4Ra4 \quad (4)$$

[Formula 2]

$$Vs4 = Vss + (I1+I2+I3+I4)Rb4 + I4Rw \quad (5)$$

$$Vs3 = Vss + (I1+I2+I3+I4)Rb4 + (I1+I2+I3)Rb3 + I3Rw \quad (6)$$

$$Vs2 = Vss + (I1+I2+I3+I4)Rb4 + (I1+I2+I3)Rb3 + (I1+I2)Rb2 + I2Rw \quad (7)$$

$$Vs1 = Vss + (I1+I2+I3+I4)Rb4 + (I1+I2+I3)Rb3 + (I1+I2)Rb2 + (I1)Rb1 + I1Rw \quad (8)$$

Accordingly, respective voltages Vds1 to Vds4 (V) between the source and the drain of MOSFETs 701-704 are given by the following formulas (9)-(12).

[Formula 3]

$$Vds1 = Vd1 - Vs1 = \\ Vdd - (I1+I2+I3+I4)Ra1 - \{Vss + (I1+I2+I3+I4)Rb4 + \\ (I1+I2+I3)Rb3 + (I1+I2)Rb2 + (I1)Rb1 + I1Rw\} \quad (9)$$

$$Vds2 = \\ Vd2 - Vs2 = Vdd - (I1+I2+I3+I4)Ra1 - (I2+I3+I4)Ra2 - \\ \{Vss + (I1+I2+I3+I4)Rb4 + (I1+I2+I3)Rb3 + \\ (I1+I2)Rb2 + I2Rw\} \quad (10)$$

$$Vds3 = Vd3 - Vs3 = Vdd - \\ (I1+I2+I3+I4)Ra1 - (I2+I3+I4)Ra2 - (I3+I4)Ra3 - \\ \{Vss + (I1+I2+I3+I4)Rb4 + (I1+I2+I3)Rb3 + I3Rw\} \quad (11)$$

$$Vds4 = \\ Vd4 - Vs4 = Vdd - (I1+I2+I3+I4)Ra1 - (I2+I3+I4)Ra2 - \\ (I3+I4)Ra3 - I4Ra4 - \{Vss + (I1+I2+I3+I4)Rb4 + I4Rw\} \quad (12)$$

Here, if V' is defined as V'=Vdd−Vss−I×(Ra1+Rb4), then the above formulas (9)-(12) can be denoted by the following formulas (13)-(16) with V'.

[Formula 4]

$$Vds1 = V' - \{(I1+I2+I3)Rb3 + (I1+I2)Rb2 + (I1)Rb1 + I1Rw\} \quad (13)$$

$$Vds2 = V' - (I2+I3+I4)Ra2 - \{(I1+I2+I3)Rb3 + (I1+I2)Rb2 + I2Rw\} \quad (14)$$

$$Vds3 = V' - (I2+I3+I4)Ra2 - (I3+I4)Ra3 - \{(I1-I2+I3)Rb3 + I3Rw\} \quad (15)$$

$$Vds4 = V' - (I2+I3+I4)Ra2 - (I3+I4)Ra3 - I4Ra4 - I4Rw \quad (16)$$

Moreover, if the electric currents which flow through respective MOSFETs 701-704 are assumed to be equal (I1=I2=I3=I4=I/4), and V is defined as V=V'−I×Rw/4, then the above formulas (13)-(16) can be denoted by the following formulas (17)-(20).

[Formula 5]

$$Vds1 = V - I(3 \times Rb3 + 2 \times Rb2 + Rb1)/4 \quad (17)$$

$$Vds2 = V - I(3 \times Ra2 + 3 \times Rb3 + 2 \times Rb2)/4 \quad (18)$$

$$Vds3 = V - I(3 \times Ra2 + 2 \times Ra3 + 3 \times Rb3)/4 \quad (19)$$

$$Vds4 = V - I(3 \times Ra2 + 2 \times Ra3 + Ra4)/4 \quad (20)$$

Next, the voltages Vds1 to Vds4, which are applied between the source electrode 21s and the drain electrode 21d of respective MOSFETs 701-704, are calculated using the above-described formulas (17)-(20), while changing the wiring resistances Ra2 to Ra4 of the above-stated metal wire 4 and the wiring resistances Rb1 to Rb3 of the above-stated metal wire 5 variously, and then the obtained calculation results are shown in [table 1].

Here, Vdd−Vds=1 (V), I=200 (A), I1=I2=I3=I4=50 (A), Rw=0.3 (mΩ), and Ra1=Rb4=0.2 (mΩ).

In this case, V=V'−I×Rw/4=0.905 (V).

beginning, the case where the wiring resistances are set to the values shown in the Examples 7 to 11 is able to make the variation of the voltage Vds (V) between the source and the drain of respective MOSFETs 701-704 small in comparison with the Examples 1-2 and the Examples 4-6.

Especially, in a case where the parallel number of MOSFET is four, when the condition where Ra4=Rb1=3×Ra2=3×Rb3 and Ra3=Rb2 is satisfied, for example, as shown in Example 7, when Ra2 is 0.1 mΩ, Ra3 is 0.2 mΩ, Ra4 is 0.3 mΩ, Rb1 is 0.3 mΩ, Rb2 is 0.2 mΩ, and Rb3 is 0.1 mΩ, the variation of the voltage Vds (V) became 0.

TABLE 1

| Examples | Wiring resistance of metal wire 4 (Ω) | | | Wiring resistance of metal wire 5 (Ω) | | | Voltage Vds between source and drain of MOSFET (V) | | | | Variation of Vds (mV) |
|---|---|---|---|---|---|---|---|---|---|---|---|
| | Ra2 | Ra3 | Ra4 | Rb1 | Rb2 | Rb3 | MOSFET701 | MOSFET702 | MOSFET703 | MOSFET704 | |
| 1 | 0.2 | 0.2 | 0.2 | 0.2 | 0.2 | 0.2 | 0.845 | 0.825 | 0.825 | 0.845 | 20 |
| 2 | 0.3 | 0.3 | 0.3 | 0.3 | 0.3 | 0.3 | 0.815 | 0.785 | 0.785 | 0.815 | 30 |
| 3 | 0.1 | 0.1 | 0.1 | 0.1 | 0.1 | 0.1 | 0.875 | 0.865 | 0.865 | 0.875 | 10 |
| 4 | 0.3 | 0.2 | 0.1 | 0.3 | 0.2 | 0.1 | 0.855 | 0.825 | 0.825 | 0.835 | 30 |
| 5 | 0.3 | 0.2 | 0.1 | 0.1 | 0.2 | 0.3 | 0.835 | 0.795 | 0.795 | 0.835 | 40 |
| 6 | 0.1 | 0.2 | 0.3 | 0.1 | 0.2 | 0.3 | 0.835 | 0.825 | 0.825 | 0.855 | 30 |
| 7 | 0.1 | 0.2 | 0.3 | 0.3 | 0.2 | 0.1 | 0.855 | 0.855 | 0.855 | 0.855 | 0 |
| 8 | 0.2 | 0.2 | 0.4 | 0.4 | 0.2 | 0.2 | 0.835 | 0.825 | 0.825 | 0.835 | 10 |
| 9 | 0.2 | 0.4 | 0.4 | 0.4 | 0.4 | 0.2 | 0.815 | 0.805 | 0.805 | 0.815 | 10 |
| 10 | 0.2 | 0.25 | 0.3 | 0.3 | 0.25 | 0.2 | 0.835 | 0.82 | 0.82 | 0.835 | 15 |
| 11 | 0.2 | 0.2 | 0.6 | 0.6 | 0.2 | 0.2 | 0.825 | 0.825 | 0.825 | 0.825 | 0 |
| 12 | 0.1 | 0.2 | 0.6 | 0.2 | 0.2 | 0.2 | 0.845 | 0.84 | 0.84 | 0.84 | 5 |
| 13 | 0.1 | 0.3 | 0.6 | 0.3 | 0.3 | 0.3 | 0.815 | 0.815 | 0.815 | 0.83 | 15 |
| 14 | 0.2 | 0.2 | 0.2 | 0.3 | 0.2 | 0.1 | 0.855 | 0.84 | 0.84 | 0.845 | 15 |

The Examples 1 to 3 which are shown in table 1 are calculation results which are calculated based on the conventional configuration. By these Examples 1 to 3, it can be understood that the variation of the voltage Vds (V) increases or decreases in response to the increase or decrease of the value of the wiring resistance when all of the wiring resistances Ra2 to Ra4 of the metal wire 4 and the wiring resistances Rb1 to Rb3 of the metal wire 5 are equal.

Moreover, the Example 4 is a case where the values of the wiring resistances Ra2 to Ra4 are allowed to become small gradually toward the electric current flowing direction, and the values of the wiring resistances Rb1 to Rb3 are allowed to become small gradually toward the electric current flowing direction. Moreover, the Example 5 is a case where the values of the wiring resistances Ra2 to Ra4 are allowed to become small gradually toward the electric current flowing direction, and the values of the wiring resistances Rb1 to Rb3 are allowed to become large gradually toward the electric current flowing direction. Moreover, the Example 6 is a case where the values of the wiring resistances Ra2 to Ra4 are allowed to become large gradually toward the electric current flowing direction, and the values of the wiring resistances Rb1 to Rb3 are allowed to become large gradually toward the electric current flowing direction.

On the contrary, in each case of Examples 7 to 11, with respect to the values of the wiring resistances Ra2 to Ra4, the resistance value of the downstream side is allowed to be larger than the resistance value of the upstream side in the electric current flowing direction, and with respect to the values of the wiring resistances Rb1 to Rb3, the resistance value of the downstream side is allowed to be smaller than the resistance value of the upstream side in the electric current flowing direction.

When the Example 3 is excepted from consideration because the wiring resistance is allowed to be small from the Moreover, as the result of having examined the case where the parallel number of MOSFET was set to n, it was understood that the variation of the voltage Vds (V) became 0 when the ratio of Ra2=Rb(n−1):Ra3=Rb(n−2): . . . :Ra(n)=Rb1 is set to 1:2: . . . :n−1.

For example, in a case where the parallel number of MOSFET is five, when Ra2=Rb4=0.1 mΩ, Ra3=Rb3=0.2 mΩ, Ra4=Rb2=0.3 mΩ, Ra5=Rb1=0.4 mΩ, the variation of the voltage Vds (V) becomes 0.

From the above-described result, when the resistance values of the metal wire of the region on which the power semiconductor elements are mounted are set so that the resistance value of the downstream side becomes larger than the resistance value of the upstream side in the electric current flowing direction, and the resistance values of the metal wire of the region to which the wires are connected are set so that the resistance value of the downstream side becomes smaller than the resistance value of the upstream side in the electric current flowing direction, it has been found out that the ununiformity of the voltage, which is applied between the source and the drain of respective power semiconductor elements, is able to be suppressed.

By the way, the Examples 12 and 13 show the results of the case where the values of the wiring resistances Ra2 to Ra4 are allowed to be set so that the resistance value of the downstream side become larger than the resistance value of the upstream side in the electric current flowing direction, and the values of the wiring resistances Rb1 to Rb3 are allowed to be set to a constant value, as in the conventional art, in the electric current flowing direction.

It has been understood that even in this case, the variation of the voltage Vds (V) is able to be made small in comparison with the case of the Examples 1 and 2. That is to say, when the resistance values of the metal wire of a region on which the power semiconductor elements (MOSFETs 701-704) are mounted are set so that the resistance value of the downstream side is larger than the resistance value of the upstream side in the electric current flowing direction, and the resistance values of the metal wire of a region to which the wires are connected are set so that the resistance value becomes constant, as in the conventional art, in the electric current flowing direction, it has been found out that the ununiformity of the voltage which is applied between the source and the drain of respective power semiconductor elements (MOSFETs 701-704) is able to be suppressed.

Moreover, the Example 14 shows the result of the case where the values of the wiring resistances Ra2 to Ra4 are allowed to be set to a constant value, as in the conventional art, in the electric current flowing direction, and the values of the wiring resistances Rb1 to Rb3 are allowed to be set so that the resistance value of the downstream side is smaller than the resistance value of the upstream side in the electric current flowing direction.

It has been understood that even in this case, the variation of the voltage Vds is able to be made small in comparison with the case of the Example 1. That is to say, when the resistance values of the metal wire of a region on which the power semiconductor elements (MOSFETs 701-704) are mounted are allowed to be set to a constant value, as in the conventional art, in the electric current flowing direction, and the resistance values of the metal wire of a region to which the wires are connected are set so that the resistance value of the downstream side is smaller than the resistance value of the upstream side in the electric current flowing direction, it has been found out that the ununiformity of the voltage which is applied between the source and the drain of respective power semiconductor elements (MOSFETs 701-704) is able to be suppressed.

As is apparent from the above description, by using the formulas (13)-(16), the setting of the resistance of each metal wire to make the voltages applied between the source and the drain of respective power semiconductor elements more uniform is able to be performed easily.

By the way, in the above case, ON states of the MOSFETs 701-704 and OFF states of the MOSFETs 801-804 are assumed, and then the voltages Vds1 to Vds4 which are applied between the source and the drain of MOSFETs 701-704, and the variation of the Vds are explained by using the table 1. But, by the assumption of OFF states of the MOSFETs 701-704 and ON states of the MOSFETs 801-804, similar results as in the table 1 can be obtained also about MOSFETs 801-804.

Figure 3:
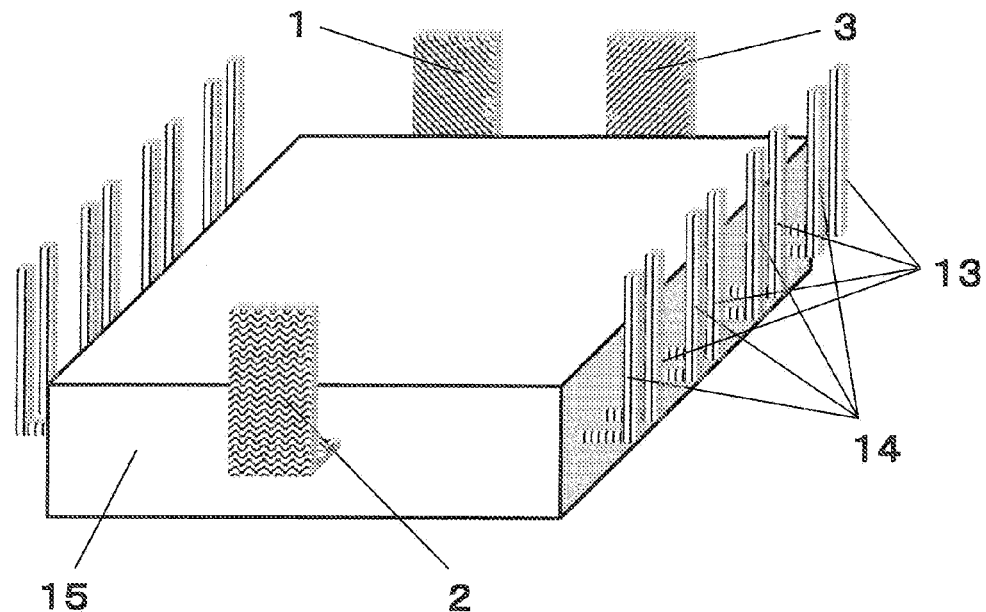
FIG. 3 is a perspective external view which shows the power semiconductor device after resin molding according to the present invention.
Figure 7:
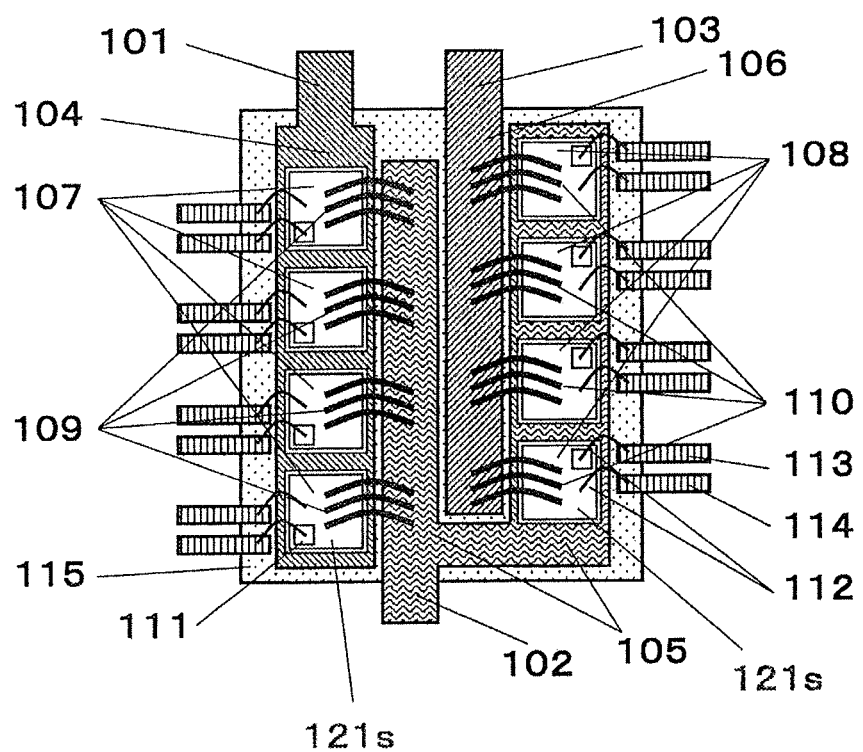
FIG. 7 is a schematic plan view which shows the internal configuration of the conventional power semiconductor device.
Figure 8:
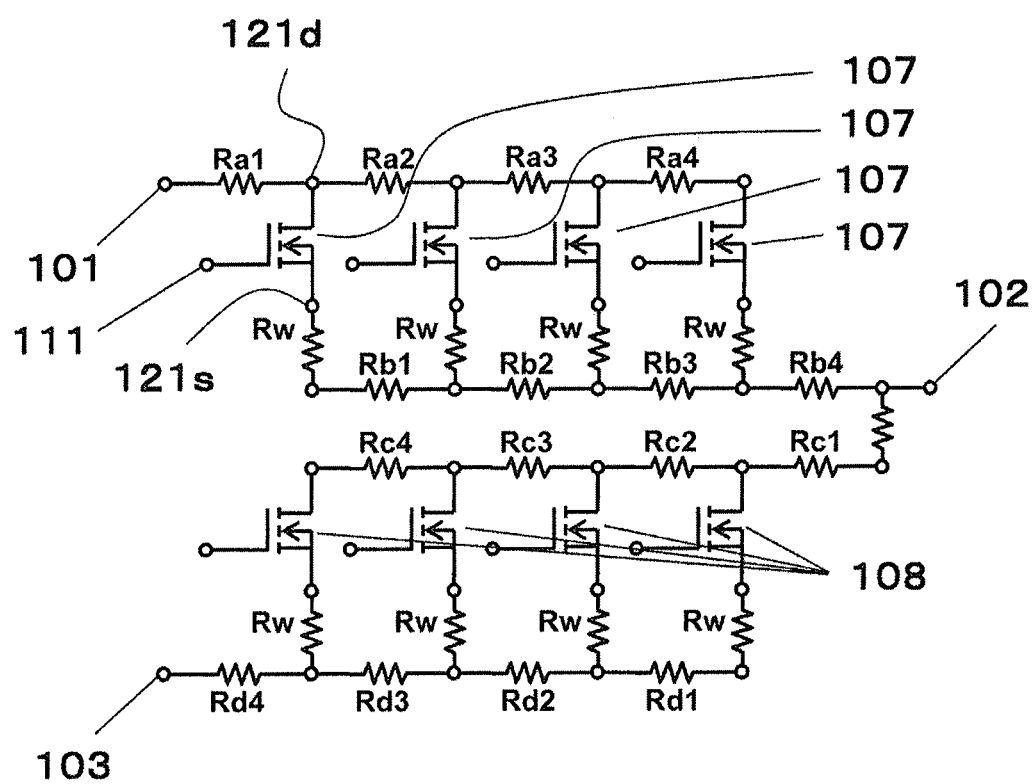
FIG. 8 is an electric circuit diagram of the conventional power semiconductor device which is shown in FIG. 7.

FIG. 3 is the perspective external view which shows the power semiconductor device after resin molding according to the present invention, and is shown that the internal configuration shown in FIG. 1 is sealed by the mold resin. It is a configuration where the external connection terminals 1, 2 and 3 for the input and output of the electric power, the gate electrode terminal 13 and the source electrode terminal 14, which are connected to a control circuit that performs control required for inverter operation, are exposed from the mold resin 15. Since there is no difference in the appearance after resin molding between the present power semiconductor device and the conventional power semiconductor device of FIG. 7, the power semiconductor device according to the present invention can substitute for the conventional power semiconductor device easily.

Embodiment 2

Figure 4:
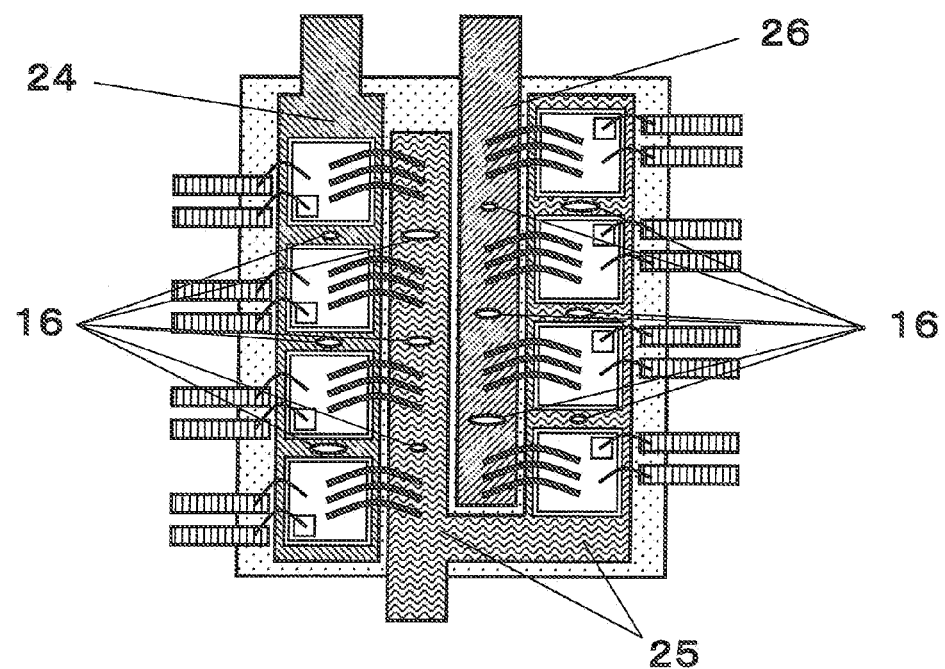
FIG. 4 is a schematic plan view which shows an internal configuration of a power semiconductor device according to other embodiment of the present invention.
Figure 5:
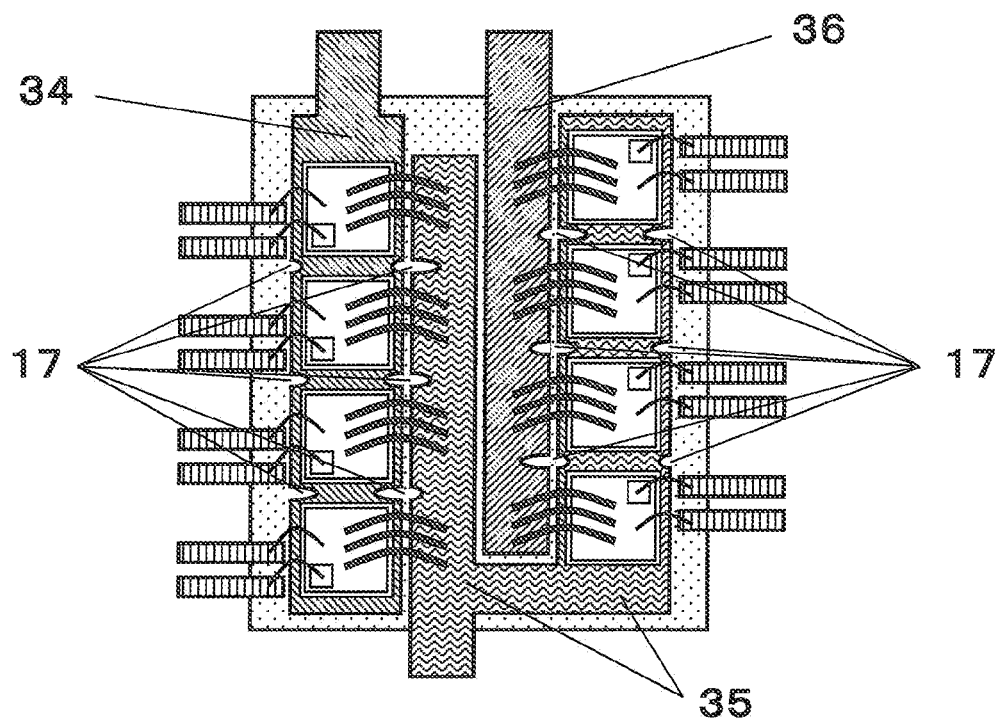
FIG. 5 is a schematic plan view which shows an internal configuration of a power semiconductor device according to other embodiment of the present invention.
Figure 6:
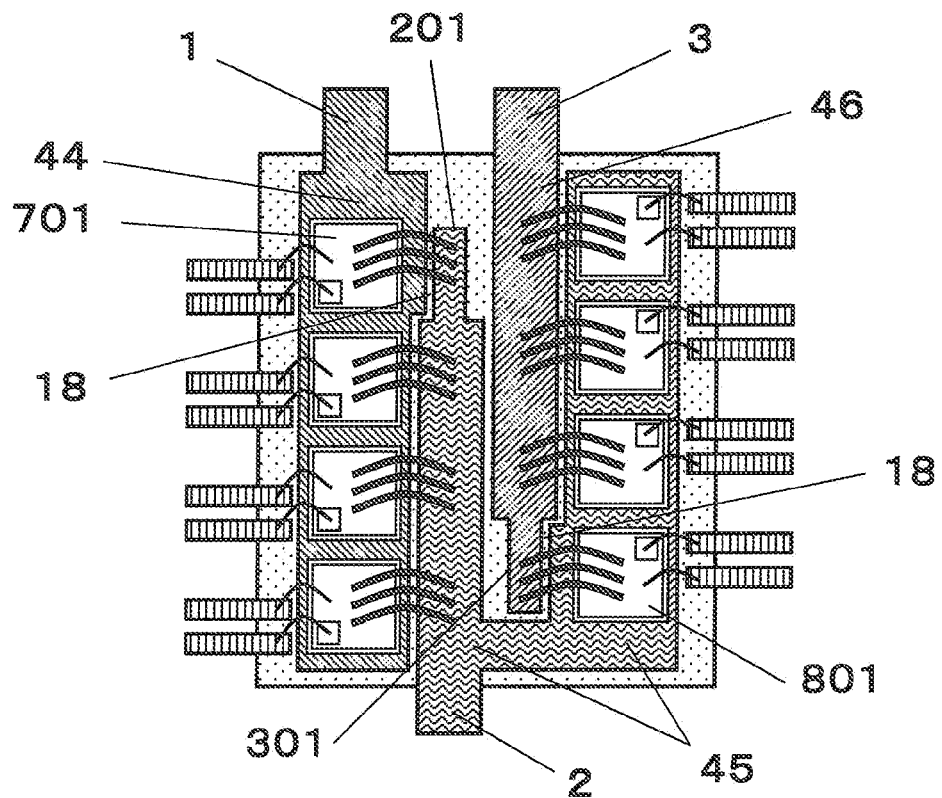
FIG. 6 is a schematic plan view which shows an internal configuration of a power semiconductor device according to other embodiment of the present invention.

FIGS. 4, 5 and 6 are schematic plan views which show internal configurations of power semiconductor devices according to other embodiments of the present invention.

As shown in FIG. 4, in the present embodiment, the widths of the metal wires 24, 25 and 26 do not change with respect to the electric current flowing direction, but the resistance values of the metal wires perform similar change of the wiring resistances as in the case of FIG. 1, because slit patterns 16 for adjusting the wire resistance (which are, for example, realized as holes that pierce the metal wire in the thickness direction thereof, or recessions) are disposed in the suitable position of the metal wires 24, 25 and 26.

Moreover, as for the case of the embodiment of FIG. 5, notch patterns 17 for adjusting the wire resistance (which are, for example, realized by denting the end part of the metal wire), with which the above-described slit patterns 16 for adjusting the wire resistance (see FIG. 4) are replaced, are disposed in the suitable positions of the metal wires 34, 35 and 36.

Moreover, as for the case of the embodiment of FIG. 6, unevenness patterns 18 for adjusting wire resistance are formed so that the widths of the wires of the wiring end portions 201 and 301 are allowed to be narrower than the widths of the external connection terminals 2 and 3, and that the width of the region, which is a part of the metal wire 44, on which the MOSFET 701 is mounted is allowed to be wider than the width of the wire of the other region of the metal wire 44, while the width of the region, which is a part of the metal wire 45, on which the MOSFET 801 is mounted is allowed to be wider than the width of the wire of the other region of the metal wire 45. The wiring end portions 201 and 301 exist on the wire connecting regions of the metal wires 45 and 46 and on the opposite sides of the external connection terminals 2 and 3. The region on which the MOSFET 701 is mounted is an element mounting region of the metal wires 44 which is opposed to the wiring end portion 201, and the region on which the MOSFET 801 is mounted is an element mounting region of the metal wires 45 which is opposed to the wiring end portion 301.

Meanwhile, in the above-described embodiments 1 and 2, a case is described where MOSFETs are used as power semiconductor elements. However, the present invention is not limited to this. For instance, IGBTs may also be used as power semiconductor elements.

Incidentally, in a case where an IGBT is used, which is different from the case of a MOSFET, it is necessary to mount a diode besides the IGBT, because the return current operation at the time of the inverter operation by the parasitic diode cannot be realized.

Meanwhile, in the above-described embodiment, a case is described where the metal wires which are formed by the lead frames are used. However, the present invention is not limited to this. For instance, the metal wires which are formed on a ceramic substrate or a metal substrate may also be used.

Moreover, the power semiconductor element is not limited to the vertical device, and the connection with the electrode of the element surface may be formed by using the bus bar in substitution for the wire.

Additionally, in the above-described embodiment, a case is described where the resin mold is performed using the mold resin in the power semiconductor device. However, the present invention is not limited to this. For instance, potting structure where a silicon resin is used or the structure in which the lid is placed on to seal may also be used.

Additionally, in the above-described embodiment, a case is described where four MOSFETs 701-704 are used as the first power semiconductor element group, and four MOSFETs 801-804 are used as the second power semiconductor element group. However, the present invention is not limited to this. For instance, even when three MOSFETs (power semiconductor elements) are used as the first power semiconductor element group, and three MOSFETs (power semiconductor elements) are used as the second power semiconductor element group, the same effect as the above can be obtained.

As described above, according to the present embodiments, when the pattern of metal wire is designed so that the wiring resistance of the metal wire may become large or small to the direction through which an electric current flows, in consideration of the voltage drop by the large electric current which flows into the metal wire, the ununiformity of the voltage applied to each power semiconductor element is able to be suppressed without affecting the reduction and equalization of the parasitic inductance and also the routing of the gate wire in parallelization of the power semiconductor elements.

As described above, the present invention improves the lifetime and reliability of the power semiconductor device, such as an inverter, and becomes important for correspondence to the large electric power and large electric current, which become increasingly important in the future. And the present invention can be used for very broad uses, such as the power conditioner of solar power generation, various motor drive control, such as an electric vehicle, an air-conditioner and the like.

INDUSTRIAL APPLICABILITY

A power semiconductor device of the present invention has an effect where it is possible to suppress the ununiformity of the voltage applied to each power semiconductor element, and is useful for a power semiconductor device for the large electric power and large electric current, and the like.

DESCRIPTION OF THE REFERENCE NUMERALS 1, 101 External connection terminal (First external connection terminal)
2, 102 External connection terminal (Second external connection terminal)
3, 103 External connection terminal (Third external connection terminal)
4, 24, 34, 44, 104 Metal wire (First metal wire)
5, 25, 35, 45, 105 Metal wire (Second metal wire)
6, 26, 36, 46, 106 Metal wire (Third metal wire)
107, 701-704 MOSFET (First power semiconductor element)
108, 801-804 MOSFET (Second power semiconductor element)
9, 109 Wire (First conductive member)
10, 110 Wire (Second conductive member)
11, 111 Gate electrode
12, 112 Bonding wire
13, 113 Gate electrode terminal
14, 114 Source electrode terminal
15, 115 Mold resin
16 Slit pattern for adjusting wire resistance
17 Notch pattern for adjusting wire resistance
18 Unevenness pattern for adjusting wire resistance

What is claimed is:
1. A power semiconductor device comprising:
a first metal wire which is connected to a first external connection terminal;
a second metal wire which is connected to a second external connection terminal;
a third metal wire which is connected to a third external connection terminal;
a first power semiconductor element group which includes three or more first power semiconductor elements that are mounted on the first metal wire; and
a second power semiconductor element group which includes second power semiconductor elements of the same number as the first power semiconductor elements, the second power semiconductor elements being mounted on the second metal wire, wherein
an electrode which the first power semiconductor element is provided with is connected to the second metal wire by a first conductive member, and an electrode which the second power semiconductor element is provided with is connected to the third metal wire by a second conductive member, and
with respect to a resistance value of a region on which the first power semiconductor element group or the second power semiconductor element group is mounted, the resistance value of a downstream side is larger than that of an upstream side in an electric current flowing direction, the region being included in the first metal wire or the second metal wire, or with respect to a resistance value of a region to which the first conductive member or the second conductive member is connected, the resistance value of a downstream side is smaller than that of an upstream side in the electric current flowing direction, the region being included in the second metal wire or the third metal wire.

2. The power semiconductor device according to claim 1, wherein regarding the first metal wire, the second metal wire and the third metal wire, regions on which the first power semiconductor element group and the second power semiconductor element group are mounted and regions to which the first conductive member and the second conductive member are connected are of straight line-like shape substantially, and the regions with the straight line-like shape of the first metal wire, the second metal wire and the third metal wire are disposed in parallel to each other substantially.

3. The power semiconductor device according to claim 2, wherein a width of the region with the straight line-like shape, on which the first power semiconductor element group or the second power semiconductor element group is mounted, becomes narrow gradually toward the electric current flowing direction, or
a width of the region with the straight line-like shape, to which the first conductive member or the second conductive member is connected, becomes wide gradually toward the electric current flowing direction.

4. The power semiconductor device according to claim 2, wherein a slit or a notch is located on the region with the straight line-like shape, on which the first power semiconductor element group or the second power semiconductor element group is mounted, and then the resistance value of the region is set so as to become large gradually toward the electric current flowing direction, or
a slit or a notch is located on the region with the straight line-like shape, to which the first conductive member or the second conductive member is connected, and then the resistance value of the region is set so as to become small gradually toward the electric current flowing direction.

5. The power semiconductor device according to claim 2, wherein regarding the regions with the straight line-like shape of the first metal wire, the second metal wire and the third metal wire, (1) the resistance values of the regions, to which the first conductive member and the second conductive member are connected, become small gradually toward the electric current flowing direction, and (2) the resistance values of the regions, on which the first power semiconductor element group and the second power semiconductor element group are mounted, become large gradually toward the electric current flowing direction.

6. The power semiconductor device according to claim 2, wherein the first external connection terminal and the third external connection terminal are connected to one side end portion of the first metal wire and one side end portion of the third metal wire, the first metal wire and the third metal wire being parallel to each other substantially and being of the straight line-like shape, and the second external connection terminal is connected to the other side end portion of the second metal wire at an opposite side of the one side end portion.

7. The power semiconductor device according to claim 1, wherein the power semiconductor device is a part which constitutes a power conversion equipment or a power conversion circuit that converts direct-current power into alternating-current power.

8. The power semiconductor device according to claim 7, wherein a direct-current voltage is applied to the first external connection terminal and the third external connection terminal and an alternating-current voltage is output from the second external connection terminal.

9. The power semiconductor device according to claim 1, wherein the first power semiconductor element or the second power semiconductor element is a MOSFET which is provided with a source electrode, a drain electrode and a gate electrode, and a parasitic diode is formed between the source electrode and the drain electrode.

10. The power semiconductor device according to claim 1, wherein the first power semiconductor element group or the second power semiconductor element group includes three or more power semiconductor elements as switching elements and one or more rectifying device.

* * * * *